(12) United States Patent
Muraguchi

(10) Patent No.: US 8,690,397 B2
(45) Date of Patent: Apr. 8, 2014

(54) OPTICAL PACKAGE ELEMENT, DISPLAY DEVICE, AND ELECTRONIC APPARATUS

(75) Inventor: Shoichi Muraguchi, Tokyo (JP)

(73) Assignee: Sony Corporation (JP)

( * ) Notice: Subject to any disclaimer, the term of this patent is extended or adjusted under 35 U.S.C. 154(b) by 104 days.

(21) Appl. No.: 12/560,886

(22) Filed: Sep. 16, 2009

(65) Prior Publication Data

US 2010/0067243 A1 Mar. 18, 2010

(30) Foreign Application Priority Data

Sep. 18, 2008 (JP) .............................. P2008-238849

(51) Int. Cl.
F21V 19/00 (2006.01)
F21V 21/00 (2006.01)
F21V 9/00 (2006.01)
F21V 1/00 (2006.01)

(52) U.S. Cl.
USPC ............ 362/382; 362/391; 362/231; 362/240

(58) Field of Classification Search
USPC .................................. 362/231, 382, 391, 240
See application file for complete search history.

(56) References Cited

U.S. PATENT DOCUMENTS

| | | | | |
|---|---|---|---|---|
| 3,793,709 A * | 2/1974 | Baumann | .......................... | 29/856 |
| 4,503,452 A * | 3/1985 | Yokozawa et al. | ............. | 257/670 |
| 4,516,148 A * | 5/1985 | Barth | ........................... | 257/735 |
| 6,113,248 A * | 9/2000 | Mistopoulos et al. | ......... | 362/240 |
| 6,731,077 B1 * | 5/2004 | Cheng | ............................ | 315/291 |
| 6,770,960 B2 * | 8/2004 | Oohata | ........................... | 257/678 |
| 7,075,118 B2 * | 7/2006 | Seki | ............................... | 257/100 |
| 7,128,438 B2 * | 10/2006 | Ratcliffe | ........................ | 362/236 |
| 7,207,693 B2 * | 4/2007 | Ratcliffe | ........................ | 362/236 |
| 7,482,633 B2 * | 1/2009 | Chiaretti | ........................ | 257/89 |
| 7,588,363 B2 * | 9/2009 | Hoelen et al. | ................. | 362/612 |
| 7,635,204 B2 * | 12/2009 | Yu | .................................. | 362/294 |
| 7,683,474 B2 * | 3/2010 | Sidwell | ......................... | 257/712 |
| 2002/0080323 A1 * | 6/2002 | Muroya | ......................... | 349/187 |
| 2003/0193803 A1 * | 10/2003 | Lin | ................................ | 362/250 |
| 2006/0071225 A1 * | 4/2006 | Beeson et al. | .................. | 257/98 |
| 2006/0181877 A1 * | 8/2006 | Sidwell | .......................... | 362/294 |
| 2006/0198128 A1 * | 9/2006 | Piepgras et al. | .............. | 362/147 |
| 2007/0268694 A1 * | 11/2007 | Bailey et al. | ................... | 362/231 |

FOREIGN PATENT DOCUMENTS

| | | |
|---|---|---|
| JP | 62-199073 | 9/1987 |
| JP | HEI 07-043726 | 2/1995 |
| JP | HEI 08-262999 | 10/1996 |

(Continued)

OTHER PUBLICATIONS

Japanese Office Action issued on Oct. 26, 2010, for corresponding Japanese Patent Application JP-2008-238849.

(Continued)

Primary Examiner — Jong-Suk (James) Lee
Assistant Examiner — Bryon T Gyllstrom
(74) Attorney, Agent, or Firm — Sheridan Ross P.C.

(57) ABSTRACT

An optical package element includes: an optical functional element having an optical functional surface; a packaging resin having light transmitting properties in which the optical functional element is embedded and whose surface facing toward the optical functional surface of the optical functional element is a light transmitting surface; conductive members connected to the optical functional element embedded in the packaging resin; and a light blocking layer provided on a surface of the conductive members facing toward the light transmitting surface.

14 Claims, 7 Drawing Sheets

(56) References Cited

FOREIGN PATENT DOCUMENTS

| JP | 2001-351266 | 12/2001 |
|---|---|---|
| JP | 2004-363380 | 12/2004 |
| JP | 2007-036019 | 2/2007 |
| JP | 2007-156387 | 6/2007 |
| JP | 2007-294725 | 11/2007 |
| JP | 2007335731 | 12/2007 |

OTHER PUBLICATIONS

Japanese Office Action for corresponding JP2008-238849 issued on Jun. 2, 2010.

\* cited by examiner

A-A'

OPTICAL PACKAGE ELEMENT, DISPLAY DEVICE, AND ELECTRONIC APPARATUS

CROSS-REFERENCES TO RELATED APPLICATIONS

The present application claims priority to Japanese Priority Patent Application JP 2008-238849 filed in the Japan Patent Office on Sep. 18, 2008, the entire contents of which is hereby incorporated by reference.

BACKGROUND

The present application relates to an optical package element provided by connecting conductive members such as electrodes and wirings to an optical functional element such as a light emitting element or light receiving element, and the invention also relates to a display device and an electronic apparatus having such an optical package element provided therein.

A display device having light emitting diodes (LEDs) arranged in the form of a matrix can display an image with a wide range of color reproducibility and high contrast because the LEDs are directly made to emit light in red, blue, and green.

A configuration as described below has been proposed as an attempt for maximizing the efficiency of extraction of light emitted by the LEDs of such a display device. Specifically, a sidewall of each of layers forming a structure of a light emitting diode is etched to form end faces which are inclined at an angle of, for example, 45 deg to principle surfaces of those layers. Further, transparent electrodes made of an indium tin oxide (ITO) or the like are formed on a layer (for example, an n-type layer) located on a light extracting side of the light emitting diode structure. Thus, light generated in the light emitting diode structure is made to undergo total reflection on the end faces inclined at 45 deg and is thereby directed toward the n-type layer on the light extracting side. Further, the light is transmitted through the transparent electrodes, and the light can therefore be extracted with improved efficiency from the side of the structure where n-type layer is provided (see JP-A-2007-335731 (Patent Document 1)).

SUMMARY

In a display device having LEDs arranged in the form of a matrix as described above, however, the light emitting diodes and wirings and driving circuits for driving the light emitting diodes are disposed on a substrate. Further, the device may employ a structure in which metal wirings are formed on the light extracting side of the LEDs instead of transparent electrodes. As a result, reflections of external light on reflective surfaces of those wirings and driving circuits constitute a factor degrading the contrast of a displayed image.

Under the circumstance, it is desirable to provide an optical package element having improved optical characteristics achieved by preventing reflections of external light at conductive members such as wiring, a display device having such an optical package element to allow display with improved contrast, and an electronic apparatus having such an optical package element to achieve improved optical characteristics.

According to one embodiment, there is provided an optical package element having a configuration in which an optical functional element such as a light emitting element or a light receiving element is embedded in a packaging resin having light transmitting properties and in which a conductive member is connected to the functional element embedded in the packaging resin. The optical functional element has an optical functional surface such as a light emitting surface or a light receiving surface. A surface of the packaging resin facing toward the optical functional surface of the optical functional element is a light transmitting surface. A light blocking layer is provided on a surface of the conductive member facing toward the light transmitting surface.

According to another embodiment, there are also provided a display device and an electronic apparatus in which an optical package element having such a configuration is provided on a substrate.

In an optical package element having such a configuration, external light which has entered the packaging resin through the light transmitting surface is blocked by the light blocking layer and is therefore prevented from being reflected by the conductive member. As a result, reflected components of the external light are prevented from being superposed on light emitted by the optical functional element. Further, it is possible to prevent components resulting from multiple reflections of the external light on various interfaces in the package from entering the optical functional element.

As described above, according to an embodiment, external light can be prevented from adversely affecting the optical functional element. As a result, the optical package element can be provided with improved optical characteristics. In a display device having such an optical package element, reflections of external light can be suppressed to achieve improved display contrast. An electronic apparatus having such an optical package element can be provided with improved optical characteristics Additional features and advantages are described herein, and will be apparent from the following Detailed Description and the figures.

DETAILED DESCRIPTION

The present application will now be described as follows in detail based on the drawings according to an embodiment.

First Embodiment (Package Element)

Figure 1:
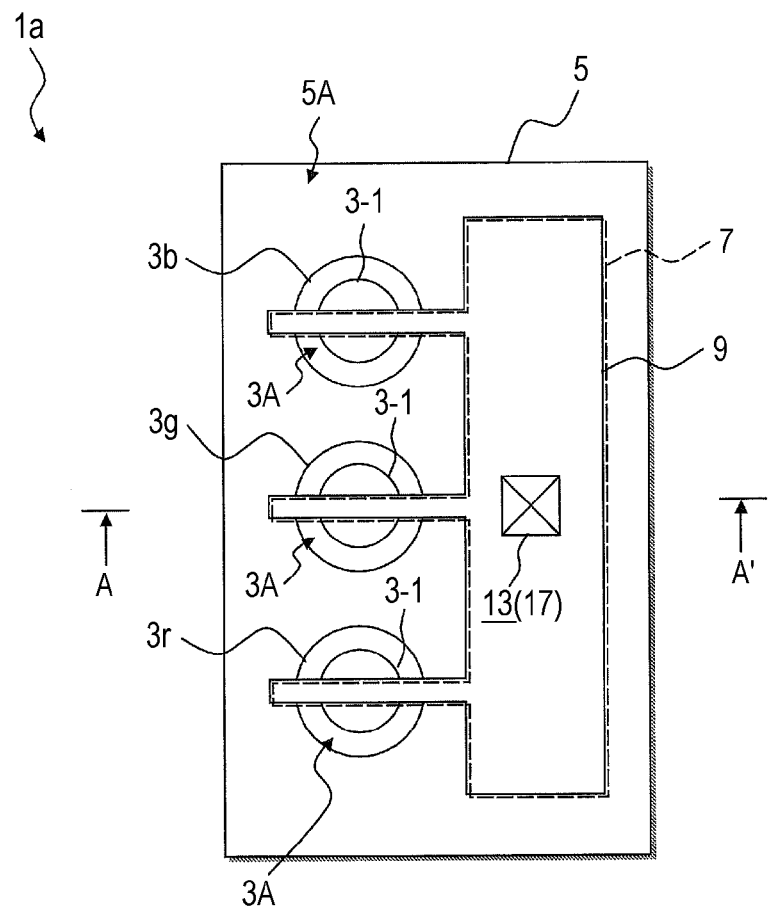
FIG. 1 shows views for explaining a configuration of an optical package element according to an embodiment.
Figure 1:
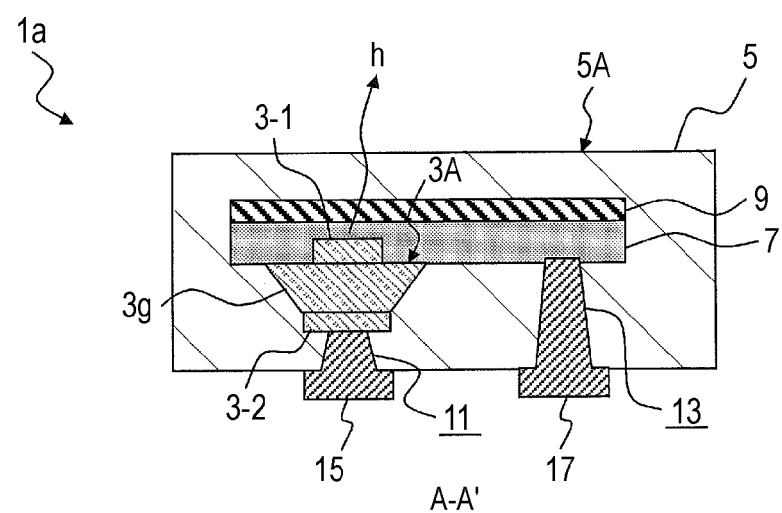

FIG. 1 shows a plan view of an optical package element 1a according to a first embodiment, and a sectional view taken along the line A-A in the plan view.

As shown in the views, the optical package element 1a is a light emitting unit formed by embedding three light emitting elements 3r, 3g, and 3b serving as optical functional elements in a packaging resin 5.

For example, the light emitting elements 3r, 3g, and 3b are light emitting diodes (LEDs), and the three elements emitting light in red (R), green (G), and blue (B), respectively, are embedded as one unit in the packaging resin 5 to form what is called a trio-chip element. Each of the light emitting elements 3r, 3g, and 3b is embedded in the packaging resin 5 with a light emitting surface 3A or an optical functional surface thereof facing toward a light transmitting surface 5A of the packaging resin 5 of the optical package element 1a. As a result, light h generated by each of the light emitting elements 3r, 3g, and 3b and emitted from the light emitting surface (optical functional surface) 3A thereof is extracted through the light transmitting surface 5A of the packaging resin 5.

A scan wiring 7, which is a conductive member, is connected to a first electrode 3-1 provided on the light emitting surface (optical functional surface) 3A of each of the light emitting elements 3r, 3g, and 3b. The scan wirings (conductive members) 7 are embedded in the packaging resin 5 and extended out of the regions above the light emitting surfaces (optical functional surfaces) 3A of the light emitting elements 3r, 3g, and 3b, and the wirings are combined into a single wiring in the positions to which they are extended. The scan wiring (conductive member) 7 having such a configuration is made of a metal material having high conductivity, and it exhibits light reflectance similar to, for example, that of aluminum.

A light blocking layer 9 is provided on a surface of the scan wiring (conductive member) 7 facing toward the light transmitting surface 5A (the surface of the packaging resin 5). The light blocking layer 9 preferably has substantially the same pattern as the scan wiring (conductive member) 7. The light blocking layer 9 may be made of a metal material such as chromium (Cr) as long as the material has high light absorbing properties. In this case, the light blocking layer 9 may function as an auxiliary wiring for the scan wiring (conductive member) 7. The light blocking layer 9 may alternatively be made of a photosensitive resin material such as a black resist. In this case, the light blocking layer 9 may be formed using a photolithographic technique, and the scan wiring (conductive member) 7 may be formed by performing etching utilizing the layer as a mask.

The packaging resin 5 embedding the light emitting elements 3r, 3g, and 3b, the scan wiring (conductive member) 7, and the light blocking layer 9 as described above may have connection holes 11 and 13 provided on a bottom surface thereof opposite to the light transmitting surface 5A. The connection holes 11 extend up to second electrodes of the light emitting elements 3r, 3g, and 3b, and the connection holes 13 extend up to the scan wiring (conductive member) 7.

A plug 15 is provided in each of the connection holes 11 in connection with a second electrode 3-2 of respective one of the light emitting elements 3r, 3g, and 3b. Plugs 17 are provided in the connection holes 13 in connection with the scan wiring (conductive member) 7.

A light blocking layer 9 may be provided not only on the scan wiring (conductive member) 7 but also on another conductive member provided in the optical package element 1a. For example, when the other conductive member has a surface having light reflecting properties and facing toward the light transmitting surface 5A, it is preferable to provide a light blocking layer 9 on the surface. For example, when the plugs 15 and 17 have tapered circumferential walls facing toward the light transmitting surface 5A, light blocking layers may be provided on the circumferential walls of the plugs 15 and 17.

The optical package element 1a is formed as described above. The packaging resin 5 forming a part of the optical package element 1a has a layered structure in accordance with process requirements, although not shown.

(Display Device)

Figure 2:
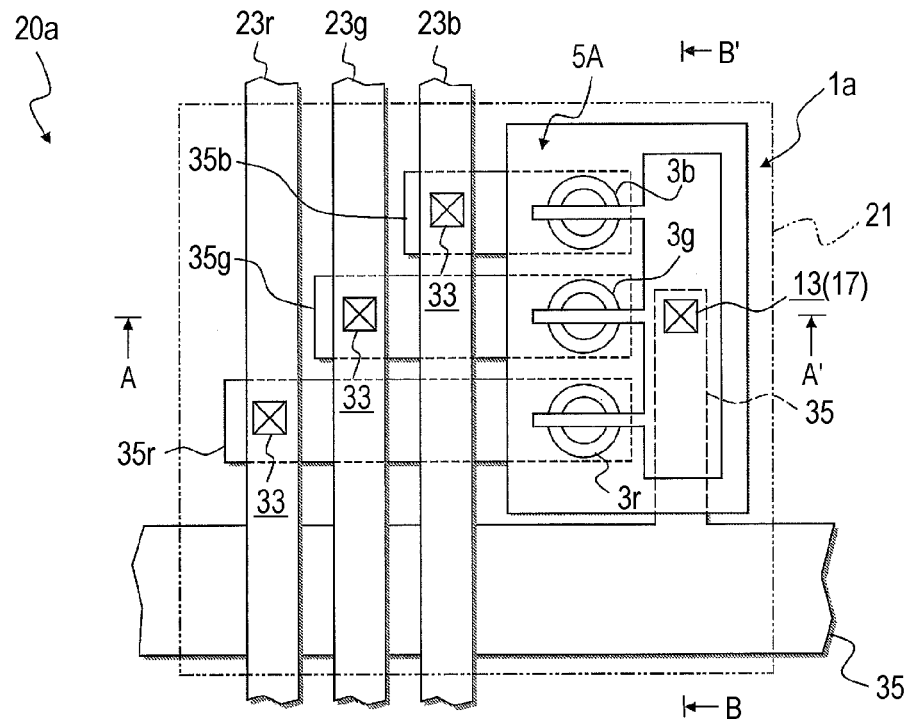
FIG. 2 shows views for explaining a configuration of a display device utilizing the optical package element according to an embodiment.
Figure 2:
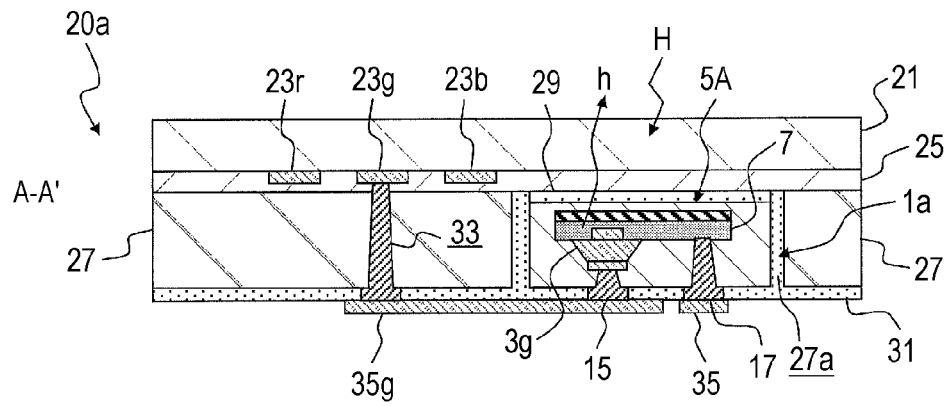
Figure 2:
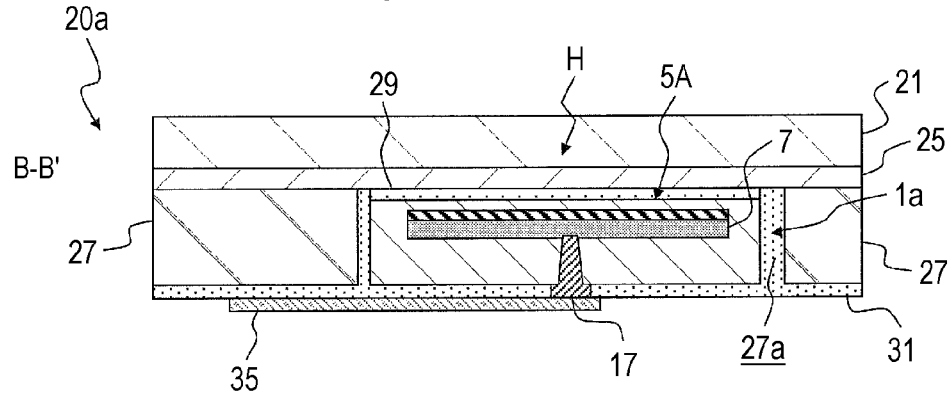

FIG. 2 shows a configuration of a display device 20a employing optical package elements 1a having the configuration described above, and includes a plan view of one pixel of the display device, a sectional view taken along the line A-A' in the plan view and a sectional view taken along the line B-B' in the plan view.

The display device 20a shown in the views carries an optical package element 1a at each of pixels on one principal surface of a substrate 21, and the optical package elements 2 are arranged in the vertical and horizontal directions in the form of a matrix.

The substrate 21 is a transparent substrate made of a transparent material, and it is specifically made of a glass material or a plastic material. For example, three signal lines 23r, 23g, and 23b are disposed on the principal surface thereof to extend in the vertical direction. The signal lines 23r, 23g, and 23b are provided to commonly serve the optical package elements 1a at respective groups of pixels arranged in the vertical direction.

An insulation film 25 is provided throughout a surface of the substrate 21 so as to cover the signal lines 23r, 23g, and 23b. Further, a partition layer 27 having insulating properties and having a thickness substantially the same as the height of the optical package elements 1a is provided on the insulation film 25. The partition layer 27 has openings 27a, and the optical package elements 1 are carried on the substrate 21 by being fitted into the openings 27a.

When the optical package elements 1a are fitted into the openings 27a of the partition layer 27, light transmitting surfaces 5A of the elements face toward the substrate 21, and the light emitting elements 3r, 3g, and 3b are arranged along the direction in which the signal lines 23r, 23g, and 23b extend. In this state, the light transmitting surfaces 5A are secured to the insulation film 25 on the substrate 21 using an adhesive 29.

Then, top surfaces of the partition layer 27 and the optical package elements 1a are covered with a leveling insulation film 31, and gaps between the partition layer 27 and the optical package elements 1a are filled with the leveling insulation film 31. The plugs 15 and 17 of the optical package elements 1a are exposed on the leveling insulation film 31.

Connection holes 33 extending up to the signal lines 23r, 23g, and 23b are provided in the leveling insulating film 31, the partition layer 27, and the insulation film 25, and signal wirings 35r, 35g, and 35b are provided on the leveling insulation film 31 in connection with the signal lines 23r, 23g, and 23b through the connection holes 33. The signal wirings 35r, 35g, and 35b are connected to the plugs 15 of the optical package elements 1a and are connected to the second electrodes 3-2 of the respective light emitting elements 3r, 3g, and 3b through the plugs 15.

A scan line 35 is provided on the leveling insulation film 31 to constitute the same layer as the signal wirings 35r, 35g, and 35b. The scan line 35 extends in the horizontal direction, and it is provided to serve the optical package elements 1a at pixels arranged in the horizontal direction. The scan line 35 is connected to the plugs 17 of the optical package elements 1a and connected to the first electrodes 3-1 of the light emitting elements 3r, 3g, and 3b through the plugs 17 and the scan wiring (conductive member) 7.

In the display device 20a having the above-described configuration, the light emitting elements 3r, 3g, and 3b of an optical package element 1a selected by the scan line 35 emit light rays h in accordance with the quantities of signals from the signal lines 23g, 23b, and 23r. The light rays h generated at the light emitting elements 3r, 3g, and 3b pass through the light transmitting surface 5A of the optical package element 1a to be extracted on the side of the device where the substrate 21 is located, whereby an image is displayed on the substrate 21 which serves as a display surface.

Specifically, the display device 20a of the first embodiment includes the light blocking layer 9 on the surface of the scan wiring (conductive member) 7 of the optical package element 1a facing toward the light transmitting surface 5A. As a result, external light H which has entered the optical package element 1a from the side of the light transmitting surface 5A through the substrate 21 is blocked by the light blocking layer 9, which prevents reflection of the light on the surface of the scan wiring (conductive member) 7. It is therefore possible to prevent degradation of display contrast attributable to reflections of the external light H superposed on the light rays h extracted from the light emitting elements 3r, 3g, and 3b. The external light H can be prevented from being reflected on conductive materials other than the scan wiring (conductive member) 7, e.g., the circumferential walls of the plugs 15 and 17, by providing a light blocking layer on such materials.

In addition, the light blocking layer 9 has substantially the same pattern and the scan wiring (conductive member) 7. Therefore, the layer does not hinder the extraction of light rays h emitted by the light emitting elements 3r, 3g, and 3b, and the efficiency of extraction of the light rays h emitted by the light emitting elements 3r, 3g, and 3b themselves can be properly maintained.

As a result, the optical package elements 1a and the display device 20a having the elements can be provided with improved display contrast.

Since the optical package elements 1a have light blocking layers on themselves, there is no need for aligning the optical package elements 1a with a light blocking layer when the elements are mounted on the substrate 21, and the alignment and patterning accuracy of light blocking layers and conductive members can be properly maintained.

Second Embodiment (Package Element)

Figure 3A:
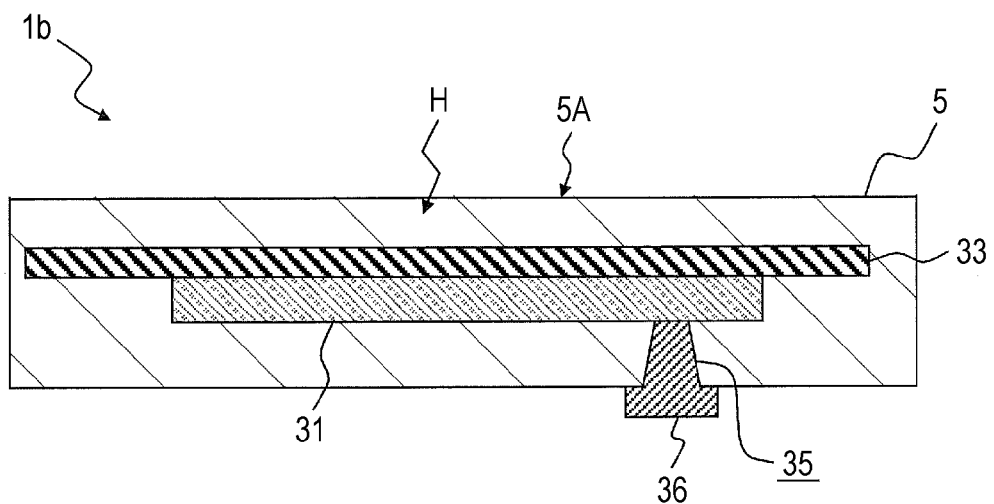
FIGS. 3A and 3B are sectional views of optical package elements according to another embodiment of the invention for explaining configurations thereof.
Figure 3B:
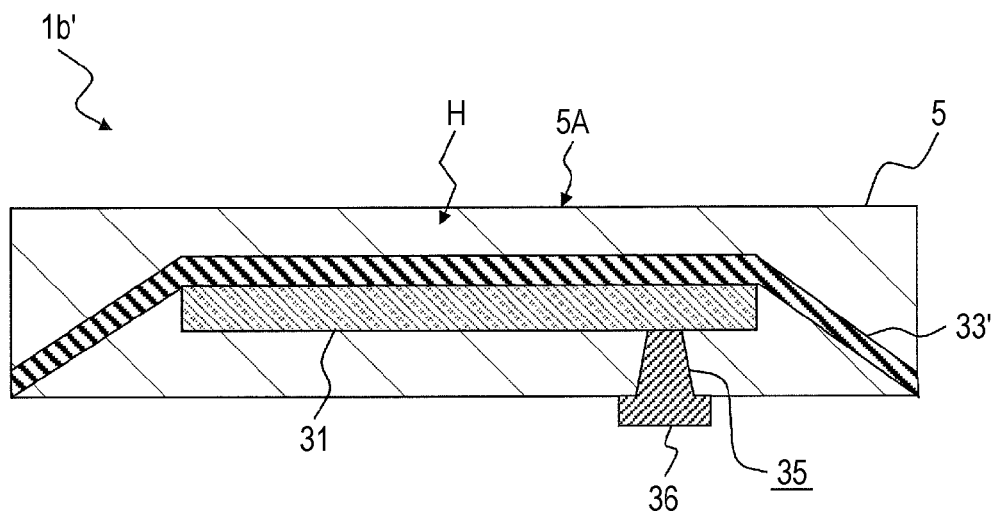

FIGS. 3A and 3b are sectional views of optical package elements 1b and 1b' according to a second embodiment.

The optical package elements 1b and 1b' shown in the figures are each provided by embedding light emitting elements (optical functional elements), which are not shown, in a packaging resin 5 similar to that of the first embodiment along with a driving element 31 for driving the light emitting elements. The driving element 31 is a semiconductor chip including, for example, a transistor and a capacitive element therein, and it is embedded in the same layer of the package resin 5 where the light emitting elements are located.

Although not shown, a conductive member for connecting the driving element 31 and the light emitting elements (optical functional elements) is provided in the packaging resin 5.

In the optical package elements 1b and 1b' having a driving elements 31 embedded therein as thus described, surfaces of the driving elements 31 facing toward light transmitting surfaces 5A of the packaging resins 5 are covered by light blocking layers 33 and 33', respectively. The light blocking layers 33 and 33' have such a size that the surfaces of the driving elements 31 will be entirely covered, and the layers are shaped such that they will not reach regions where optical functional elements (light emitting elements) embedded in the same respective packaging resins 5 are disposed.

The conductive members connecting the driving elements 31 and the light emitting elements (optical functional elements) also have light blocking layers which are provided on surfaces of the members facing toward the light transmitting surfaces 5A. The light blocking layers may have the same pattern as that of the conductive members.

As apparent from the illustration of the optical package element 1b' in FIG. 3B, a light blocking layer 33' may be provided, which also obscures a circumferential wall of the driving element 31 when viewed from the side of the light transmitting surface 5A.

On bottom surfaces or surfaces opposite to the light transmitting surfaces 5A of the packaging resins 5 of the optical package elements 1b and 1b' as thus described, connection holes 35 may be provided such that they reach the driving elements 31. Those connection holes 35 reach electrode pad portions (not shown) of the driving elements 31, and the holes are filled with plugs 36.

The packaging resins 5 forming part of the optical package elements 1b and 1b' may have a layered structure in accordance with process requirements, which is the same as the first embodiment.

(Display Device)

A display device utilizing optical package elements 1b or 1b' having the above-described configuration is mounted on a substrate 21 in the same manner as in the first embodiment described with reference to FIG. 2. Wirings such as signal lines 23r, 23g, and 23b, signal wirings 35r, 35g, and 35b, and a scan line 35 are provided on the substrate 21 in a circuit configuration as required.

Particularly, the display device of the second embodiment employs a configuration in which an optical package element 1b or 1b' including a driving element 31 has a light blocking layer 33 or 33' provided on a surface of the driving element 31 facing toward a light transmitting surface 5A. Thus, external light H which has entered through the light transmitting surface 5A of the optical package element 1b or 1b' is blocked by the light blocking layer 33 or 33', and the external light can be prevented from being reflected on the surface of the driving element 31. It is therefore possible to prevent degradation of display contrast attributable to reflections of the external light H superposed on light h extracted from light emitting elements embedded in the same package.

Especially, the configuration shown in FIG. 3B employing the light blocking layer 33' covering even a circumferential wall of the driving element 31 is advantageous in that crosstalk attributable to lateral propagation of the light h output from the light emitting elements can be suppressed. An improvement in contrast is expected from the configuration.

It is also possible to prevent erroneous operations of the driving element 31 such as a drift attributable to photoelectric effects caused by incidence of external light H on the driving element 31.

As apparent from the above, the optical package element 1b or 1b' including a driving element 31 embedded in the same package also allows an improvement in display contrast when provided in a display device, and the element can be accurately driven for displaying an image with high quality.

In the above-described second embodiment, the driving element 31 and the light emitting elements (optical functional elements) are embedded in the same packaging resin 5. The driving element 31 may alternatively be embedded in a packaging resin different from that embedding the light emitting elements (optical functional elements). Further, the driving element may be mounted on a substrate separate from the optical package element. The advantages of the second embodiment can be similarly achieved also in such a case by providing the light blocking layer 33 or 33' on the surface of the driving element 31 facing toward the light transmitting surface 5A.

For example, a light receiving element for measuring the brightness of display environment may be embedded in the same packaging resin 5 embedding the light emitting elements (optical functional elements) in order to adjust the intensity of the light emitted by the light emitting elements in accordance with the brightness of the display environment.

The light receiving element is one type of optical functional elements, and the element has a light receiving surface as an optical functional surface. Therefore, the light receiving element is embedded in the packaging resin with its light receiving surface facing toward the light transmitting surface 5A of the packaging resin 5. In this case, a light blocking layer is provided on a surface of a conductive member such as a wiring connected to the light receiving element facing toward the light transmitting surface 5A. Thus, external light H which has entered the optical package element through the light transmitting surface 5A is blocked by the light blocking layer, and the light is therefore prevented from impinging on the light receiving surface of the light receiving element as a result of multiple reflections of the light on various interfaces in the package. Consequently, display contrast is improved as described above, and the measurement of light received by the light receiving element can be highly accurately carried out with noise components eliminated from the light.

Such a light receiving element may be embedded in a packaging resin separate from the packaging resin embedding the light emitting elements (optical functional elements) to form a separate optical package element which is mounted on the substrate separately from the optical package element having the light emitting elements embedded therein. The above-described advantages can be achieved also in this case because the light blocking layer is provided on the surface of the conductive member provided along with the light receiving elements which faces toward the light transmitting surface of the packaging resin.

An electronic apparatus such as an imaging apparatus may be provided by arranging, for example, optical package elements having only light receiving elements embedded therein. A light blocking layer may be provided on a surface of a conductive member provided along with a light receiving element facing toward the light transmitting surface of the respective packaging resin, also in such a case. Thus, light received by the light receiving element can be highly accurately measured with noise components eliminated from the light.

(Manufacturing Method)

A method of manufacturing an optical package element as described above and a method of manufacturing a display device as an electronic apparatus utilizing such elements will be described with reference to FIGS. 4 to 7E. Specifically, a description will be made on methods of manufacturing an optical package element and a display device having configurations according to the first embodiment shown in FIGS. 1 and 2. When the same members as described above with reference to FIGS. 1 and 2 appear in the following description, they will be indicated by the same reference numerals.

Figure 4:
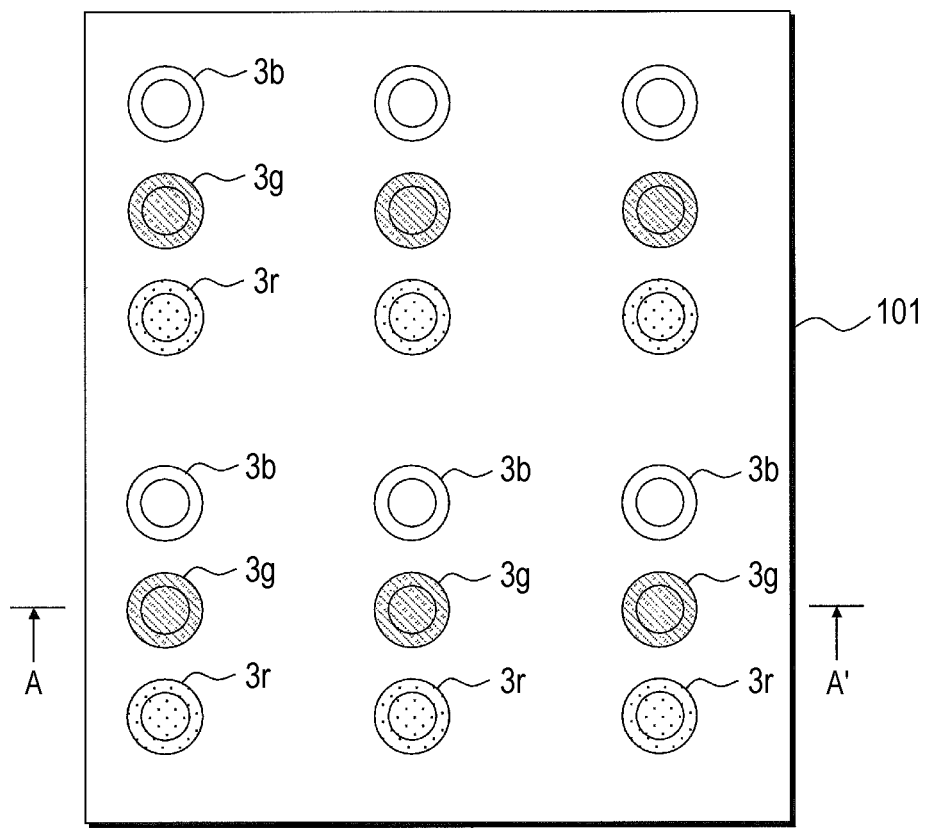
FIG. 4 shows a manufacturing flow chart (chart 1) of a semiconductor package according to an embodiment.
Figure 4:
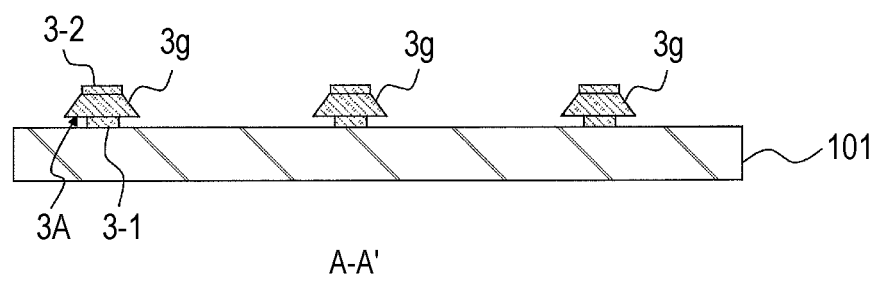

As shown in the plan view of FIG. 4 and the sectional view taken along the line A-A' shown in FIG. 4, light emitting elements 3r, 3g, and 3b of red (R), green (G), and blue (B) are transferred from semiconductor substrates having arrays of light emitting elements 3r, 3g, and 3b of the respective colors formed thereon onto a first intermediate substrate 101, the elements being transferred in groups each arranged to provide the set of colors. On the first intermediate substrate, first electrodes 3-1 of the light emitting elements 3r, 3g, and 3b face toward light emitting surfaces (optical functional surfaces) 3A of the elements.

Manufacturing steps will now be described according to a flow chart in sectional views shown in FIGS. 5A to 5E associated with the A-A' section shown in FIG. 4. Although only light emitting elements 3g are shown in the sectional views, when a process is similarly carried out on the other elements, the description may specify the light emitting elements 3r, 3g, and 3b as the elements of interest.

Figure 5A:
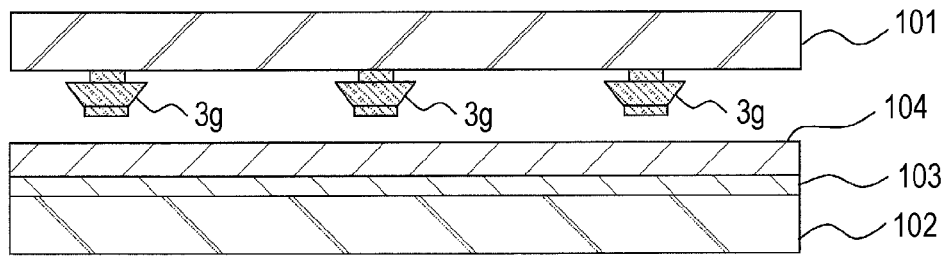
FIGS. 5A to 5E are a manufacturing flow chart (chart 2) of the semiconductor package according to an embodiment.

As shown in FIG. 5A, a photosensitive embedding resin layer 104 is formed on a second intermediate substrate 102 with an insulating resin layer 103 interposed between them. The surface of the first intermediate substrate on which the light emitting elements 3r, 3g, and 3b are mounted is disposed to face the embedded resin layer 104.

Figure 5B:
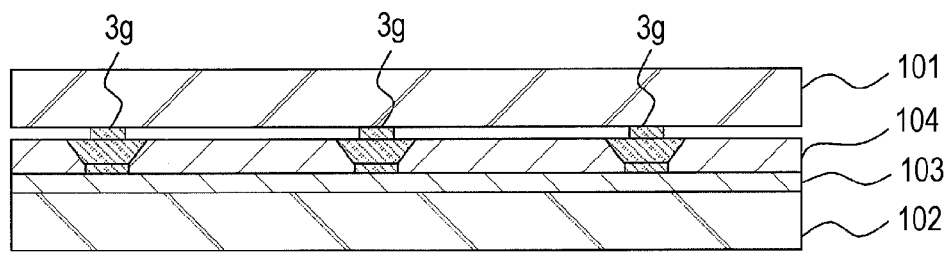

In this state, the first intermediate substrate 101 and the second intermediate substrate 102 are pressed against each other as shown in FIG. 5B to embed the light emitting elements 3r, 3g, and 3b on the first intermediate substrate 101 in the embedding resin layer 104. The embedding resin layer 104 is cured by irradiating it with ultraviolet light in this state to secure the light emitting elements 3r, 3g, and 3b in the embedding resin layer 104.

Figure 5C:
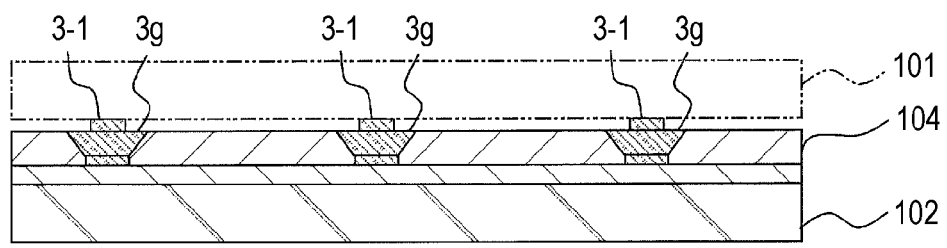

Thereafter, the first intermediate substrate 101 is removed from the second intermediate substrate 102 having the light emitting elements 3r, 3g, and 3b secured in the embedding resin layer 104 thereof, as shown in FIG. 5C. In this state, the first electrodes 3-1 of the light emitting elements 3r, 3g, and 3b are exposed on the surface of the embedding resin layer 104.

Figure 5D:
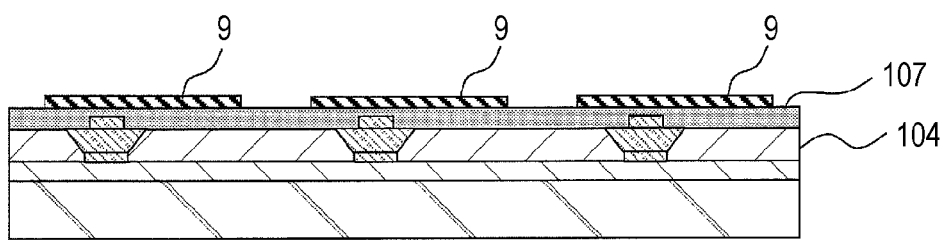

Next, a conductive material film 107 made of, for example, aluminum is formed on the embedding resin layer 104 as shown in FIG. 5D, and a resist pattern made of a black resist to serve as light blocking layers 9 is formed on the film using a photolithographic technique.

Figure 5E:
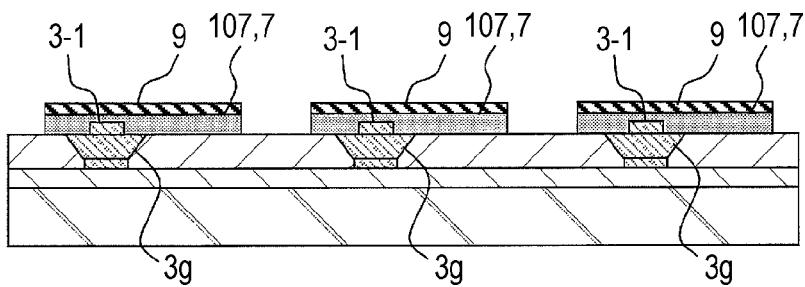

Next, as shown in FIG. 5E, the conductive material film 107 is etched using the light blocking layers 9 as a mask to pattern it into scan wirings (conductive members) 7 which are in contact with the first electrodes 3-1 of the respective light emitting elements 3r, 3g, and 3b.

Figure 6A:
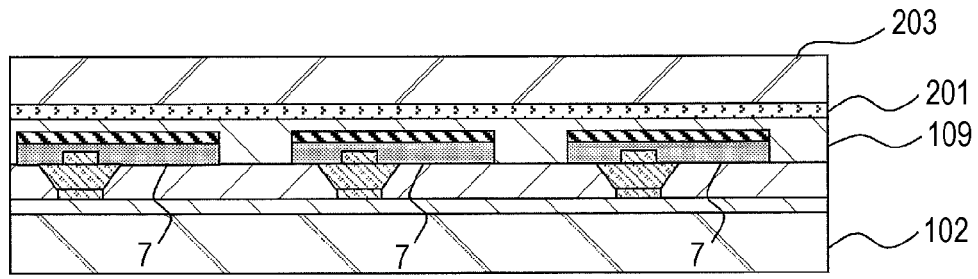
FIGS. 6A to 6D are a manufacturing flow chart (chart 3) of the semiconductor package according to an embodiment.

After the above-described steps, as shown in FIG. 6A, the surface of the second intermediate substrate 102 on which the scan wirings (conductive members) 7 are formed is covered with an insulating resin layer 109, and a third intermediate substrate 203 is laid over the layer with a separation film 201 interposed between them.

Figure 6B:
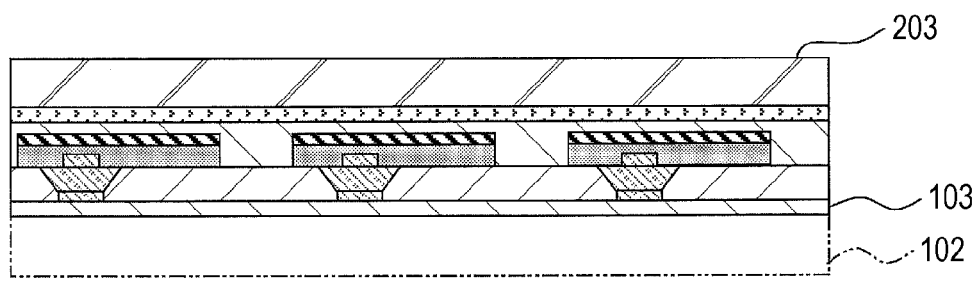

Next, as shown in FIG. 6B, the second intermediate substrate 102 is removed from the insulating resin layer 103 with the light emitting elements 3r, 3g, and 3b and the scan wirings (conductive members) 7 left on the third intermediate substrate 203.

Figure 6C:
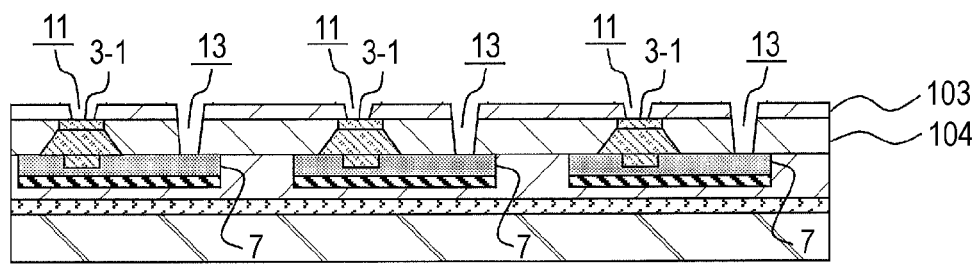

Thereafter, as shown in FIG. 6C, connection holes 11 are formed in the insulating resin layer 103 such that they reach the first electrodes 3-1 of the light emitting elements 3r, 3g, and 3b, and connection holes 13 are formed in the insulating resin layer 103 and the embedding resin layer 104 such that they reach the scan wirings (conductive members) 7.

Figure 6D:
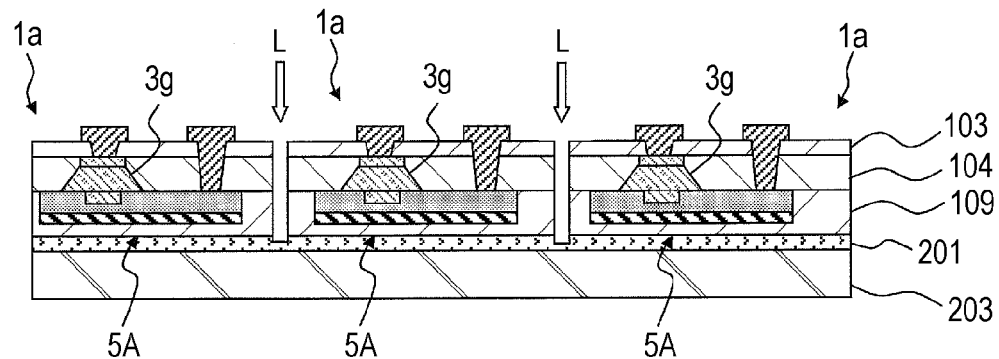

Next, as shown in FIG. 6D, plugs 15 are formed to extend through the connection holes 11 up to the first electrodes 3-1, and plugs 17 are formed to extend through the connection holes 13 up to the scan wirings 7. Thereafter, laser irradiation L is carried out to form separations extending through the insulating resin layer 103, the embedding resin layer 104, and the insulating resin layer 109, thereby forming groups of light emitting elements each including elements 3r, 3g, and 3b for three colors. Each part resulting from the separation constitutes an optical package element 1a as described with reference to FIG. 1. As a result, a plurality of optical package elements 1a are provided on the third intermediate substrate 203 with the separation layer 201 interposed between them. The sectional view of such optical package elements 1a shown in FIG. 6D is similar to an inverted version of the A-A' sectional view shown in FIG. 1.

An optical package element 1a formed as described above includes light emitting elements 3r, 3g, and 3b embedded in a packaging resin 5 having a three-layer structure formed by the insulating resin layer 103, the embedding resin layer 104, and the insulating resin layer 109. A surface of the packaging resin 5 facing toward the third intermediate substrate 203 serves as a light transmitting surface 5A.

The separation layer is irradiated with a laser in this state from the side of the third intermediate substrate 203 to release the optical package elements 1a from the third intermediate substrate 203.

Figure 7A:
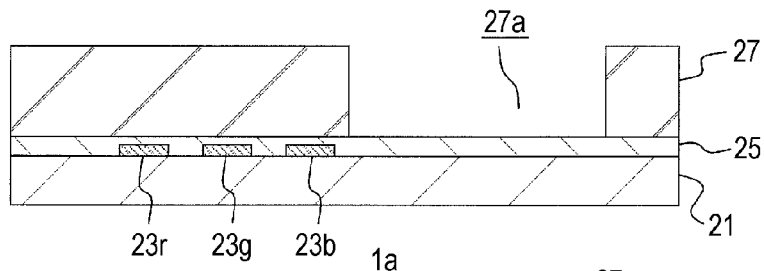
FIGS. 7A to 7E are a manufacturing flow chart of a display device according to an embodiment of the invention.

As shown in FIG. 7A, a substrate 21 having light transmitting properties to serve as a device substrate is prepared, and patterns to serve as signal lines 23r, 23g, and 23b are formed on the substrate. An insulation film 25 is formed throughout the substrate 21 so as to cover the signal lines 23r, 23g, and 23b. Further, an insulating partition layer 27 having a height similar to that of optical package elements 1a is formed on the insulation film 25. The partition layer 27 is provided with openings 27a into which optical package elements 1a are to be fitted.

Figure 7B:
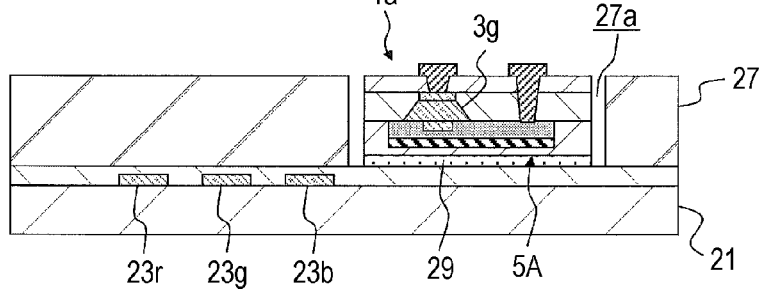

Next, as shown in FIG. 7B, an optical package element 1a is fitted and secured in each of the openings 27a of the partition layer 27. At this time, the optical package element 1a is aligned with the substrate 21 such that the light transmitting surface 5A of the optical package element 1a faces the substrate 21 and such that the light emitting elements 3r, 3g, and 3b are arranged along the direction in which the signal lines 23r, 23g, and 23b extend. Then, the light transmitting surface 5A is secured to the insulation film 25 on the substrate 21 using an adhesive 29.

Figure 7C:
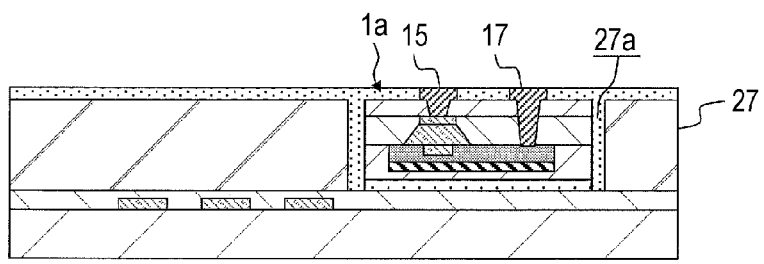

Next, as shown in FIG. 7C, top surfaces of the partition layer 27 and the optical package elements 1a are covered with a leveling insulation film 31, and gaps between the partition layer 27 and the optical package elements 1a are filled with the leveling insulation film 31. At this time, the plugs 15 and 17 of the optical package elements 1a are exposed on the leveling insulation film 31.

Figure 7D:
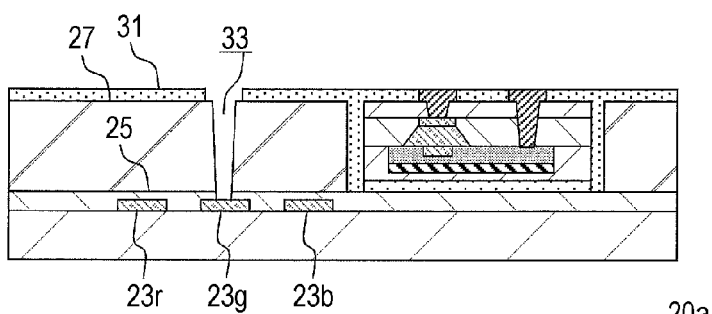

Next, as shown in FIG. 7D, connection holes 33 extending up to the signal lines 23r, 23g, and 23b are formed in the leveling insulation film 31, the partition layer 27, and the insulation film 25. The illustration shows only a connection hole 33 extending up to a signal line 23g.

Figure 7E:
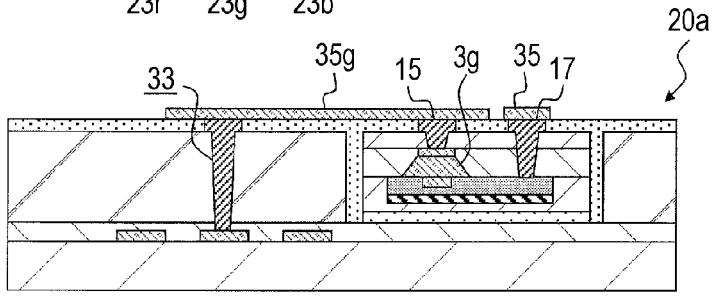

Next, signal wirings 35r, 35g, and 35b, which are connected to the signal lines 23r, 23g, and 23b through the respective connection holes 33 and connected to the light emitting elements 3r, 3g, and 3b, respectively, through the plugs 15, are formed on the leveling insulation film 31 as shown in FIG. 7E. At the same step, a scan line 35 connected to the scan wirings (conductive members) 7 through the plugs 17 is formed on the leveling insulation film 31.

A display device 20a having the configuration described with reference to FIG. 2 can be provided through the above-described steps. FIG. 7E is similar to an inverted version of the A-A' sectional view shown in FIG. 2.

The above-described manufacturing method is merely an example, and the configuration for incorporating the optical package elements 1a in the display device 20a is not limited to that shown in FIG. 2.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An optical package element comprising:
   an optical functional element having a light emitting surface and a non-light emitting surface positioned opposite to the light emitting surface;
   a packaging resin having light transmitting properties in which the optical functional element is embedded and having a light transmitting surface;
   a first electrode formed on a portion of the light emitting surface of the optical functional element;
   a second electrode formed on the non-light emitting surface of the optical functional element;
   conductive members connected to the optical functional element embedded in the packaging resin, a first side of the conductive members being formed on portions of the first electrode and the light emitting surface of the optical functional element; and
   a conductive light blocking layer embedded in the packaging resin having light absorbing properties that is provided only on an upper surface a second side of the conductive members that is opposed to the first side, wherein the light blocking layer is made of a material that prevents reflection of light on a surface of at least one of the conductive members,
   wherein the light blocking layer and the conductive members extend across at least part of the light emitting surface of the optical functional element.

2. An optical package element according to claim 1, wherein the optical functional element is at least one selected from the group consisting of a light emitting element and a light receiving element.

3. An optical package element according to claim 1, wherein the light blocking layer is made of a conductive material.

4. An optical package element according to claim 1, wherein the light blocking layer has the same pattern as the conductive members.

5. An optical package element according to claim 1, wherein a plurality of light emitting elements are embedded as the optical functional element in the packaging resin.

6. An optical package element according to claim 1, wherein:
   a driving element for driving the optical functional element is embedded in the packaging resin along with the optical functional element; and
   a side of the driving element facing toward the light transmitting surface is covered with a light blocking layer.

7. An optical package element according to claim 1, wherein the packaging resin includes a plurality of connection holes on a bottom surface thereof, a first connection hole extending up to the conductive members and a second connection hole extending up to the second electrode.

8. An optical package element according to claim 7, wherein the first connection hole is provided with a first conductive plug, and the second connection hole is provided with a second conductive plug.

9. An optical package element according to claim 8, wherein the first and second plugs have tapered circumferential walls facing the light transmitting surface.

10. An optical package element according to claim 9, wherein the tapered circumferential walls are covered with additional light blocking layers having light absorbing properties.

11. A display device comprising:
an optical package element including:
a light emitting element having a light emitting surface and a non-light emitting surface positioned opposite to the light emitting surface,
a packaging resin having light transmitting properties in which the light emitting element is embedded and having a light transmitting surface,
a first electrode formed on a portion of the light emitting surface of the light emitting element,
a second electrode formed on the non-light emitting surface of the light emitting element,
conductive members connected to the light emitting element embedded in the packaging resin, a first side of the conductive members being formed on portions of the first electrode and the light emitting surface of the optical functional element, and a conductive light blocking layer embedded in the packaging resin having light absorbing properties that is provided only on an upper surface a second side of the conductive members that is opposed to the first side, wherein the light blocking layer is made of a material that prevents reflection of light on a surface of at least one of the conductive members,
wherein the light blocking layer and the conductive members extend across at least part of the light emitting surface of the light emitting element, and
wherein the optical package element is mounted on a substrate.

12. A display device according to claim 11, wherein:
a driving element for driving the light emitting element is mounted on the substrate in a state in which it is embedded in a packaging resin; and
a side of the light emitting element facing toward the light emitting surface is covered with a light blocking layer.

13. A display device according to claim 12, wherein the driving element is embedded in the same packaging resin embedding the light emitting element.

14. An electronic apparatus comprising: an optical package element including: an optical functional element having an light emitting surface and a non-light emitting surface positioned opposite to the light emitting surface, a packaging resin having light transmitting properties in which the optical functional element is embedded and having a light transmitting surface, a first electrode formed on a portion of the light emitting surface of the optical functional element, a second electrode formed on the non-light emitting surface of the optical functional element, conductive members connected to the optical functional element embedded in the packaging resin, a first side of the conductive members being formed on portions of the first electrode and the light emitting surface of the optical functional element, and a conductive light blocking layer embedded in the packaging resin having light absorbing properties that is provided only on an upper surface a second side of the conductive members that is opposed to the first side, wherein the light blocking layer is made of a material that prevents reflection of light on a surface of at least one of the conductive members, wherein the light blocking layer and the conductive members extend across at least part of the light emitting surface of the light emitting element, and wherein the optical package element is mounted on a substrate.

* * * * *